United States Patent
Cook et al.

(10) Patent No.: US 6,321,680 B2
(45) Date of Patent: *Nov. 27, 2001

(54) VERTICAL PLASMA ENHANCED PROCESS APPARATUS AND METHOD

(75) Inventors: Robert C. Cook; Daniel L. Brors, both of Livermore, CA (US)

(73) Assignee: Torrex Equipment Corporation, Livermore, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/228,840

(22) Filed: Jan. 12, 1999

Related U.S. Application Data

(63) Continuation-in-part of application No. 08/909,461, filed on Aug. 11, 1997.
(60) Provisional application No. 60/071,571, filed on Jan. 15, 1998.

(51) Int. Cl.$^7$ .................. C23C 16/509; C23C 16/46; C23C 16/505

(52) U.S. Cl. .............. 118/723 E; 118/719; 118/730; 118/725; 118/625; 118/638; 118/641

(58) Field of Search ................... 156/345, 646.1; 118/50.1, 728, 724, 723 E, 719, 725, 723 MP; 414/217; 204/164, 298.37; 165/206; 219/121.43; 347/140; 427/248.1; 438/308, 710, 715, 788

(56) References Cited

U.S. PATENT DOCUMENTS

| | | | | |
|---|---|---|---|---|
| 4,178,877 | * | 12/1979 | Kudo ..................................... | 118/728 |
| 4,258,658 | * | 3/1981 | Politycki et al. ..................... | 118/719 |
| 4,292,153 | * | 9/1981 | Kudo et al. ........................... | 204/164 |
| 4,381,965 | * | 5/1983 | Maher, Jr. et al. .................. | 156/345 |
| 4,565,157 | * | 1/1986 | Brors et al. .......................... | 118/719 |
| 4,653,428 | * | 3/1987 | Wilson et al. ....................... | 118/725 |
| 4,811,684 | * | 3/1989 | Tashiro et al. ...................... | 118/50.1 |
| 5,097,890 | * | 3/1992 | Nakao .................................. | 165/206 |
| 5,356,475 | * | 10/1994 | Diiorio et al. ..................... | 118/723 E |
| 5,383,984 | * | 1/1995 | Shimada et al. ..................... | 156/345 |
| 5,458,689 | * | 10/1995 | Saito .................................... | 118/724 |
| 5,584,963 | * | 12/1996 | Takahashi .......................... | 156/646.1 |
| 5,613,821 | * | 3/1997 | Muka et al. ........................ | 414/217.1 |
| 5,795,452 | * | 8/1998 | Kinoshita et al. .............. | 204/298.37 |

\* cited by examiner

*Primary Examiner*—Gregory Mills
*Assistant Examiner*—Rudy Zervigon
(74) *Attorney, Agent, or Firm*—Pillsbury Winthrop LLP; David H. Jaffer

(57) ABSTRACT

A plasma enhanced chemical vapor deposition (PECVD) system having an upper chamber for performing a plasma enhanced process, and a lower chamber having an access port for loading and unloading wafers to and from a wafer boat. The system includes apparatus for moving the wafer boat from the upper chamber to the lower chamber. The wafer boat includes susceptors for suspending wafers horizontally, spaced apart in a vertical stack. An RF plate is positioned in the boat above each wafer for generating an enhanced plasma. An RF connection is provided which allows RF energy to be transmitted to the RF plates while the wafer boat is rotated. Apparatus for automatic wafer loading and unloading is provided, including apparatus for lifting each wafer from its supporting susceptor and a robotic arm for unloading and loading the wafers.

4 Claims, 19 Drawing Sheets

Cross Section A-A

Section E

Section I

VERTICAL PLASMA ENHANCED PROCESS APPARATUS AND METHOD

This application claims the benefit of U.S. Provisional Application Ser. No. 60/071,571 filed Jan. 15, 1998, and is a continuation-inpart of copending U.S. Application Ser. No. 08/909,461 filed Aug. 11, 1997 (pending).

BACKGROUND OF THE INVENTION

1. Field of the Invention

The present invention relates generally to methods and apparatus for plasma enhanced chemical vapor deposition (PECVD) on wafers and plasma enhanced etching of wafers, and more particularly to a method and apparatus for transmitting RF energy to create a localized glow discharge over surfaces of wafers stacked vertically on a rotating wafer boat, and apparatus for robotically inserting and removing the wafers.

2. Brief Description of the Prior Art

There are a large number of plasma enhanced processes that are performed inside of enclosed chambers wherein the pressure, temperature, composition of gases and application of radio frequency (RF) power are controlled to (a) produce the desired thin film deposition of various materials onto substrates such as semiconductor wafers, flat panel displays and others, and (b) to remove various materials from such substrates via etching. For convenience, the term "wafer" as used in the following description of the prior art and in the disclosure of the present invention will be used with the understanding that the invention also applies to the manufacture of flat panel displays and other types of substrates or devices wherein plasma enhanced processes are employed. For example, silicon nitride is typically deposited via plasma enhanced chemical vapor deposition (PECVD) on top of metal layers on a semiconductor wafer. A main feature of PECVD processes is that they can be carried out at low substrate temperatures as described by S. Wolf and R. N. Tauber, "Silicon Processing for the VLSI Era", Volume 1-Process Technology, Lattice Press, 1986, pp. 171–174. FIG. 1 shows a chamber 10 having a rotating susceptor 12 capable of holding a plurality of substrates. RF energy is applied to an upper electrode 14 to create an electric field causing a plasma (glow discharge) creating free electrons within the plasma region 16. The electrons gain sufficient energy from the electric field so that when they collide with gas molecules, gas-phase dissociation and ionization of the reactant gases (e.g. silane and nitrogen) occurs. The energetic species are then adsorbed on the film surface.

FIG. 2 shows another prior art device including a single wafer PECVD chamber 18 wherein a wafer 20 is held stationary. There are a variety of single wafer PECVD chamber designs available in the marketplace. There are also a variety of commercially available multiple wafer chambers as described above wherein the wafers are all supported by a susceptor in a single horizontal plane.

The single wafer and horizontal multiple wafer PECVD chamber designs discussed above are problematic for numerous reasons. First, such single wafer designs suffer from relatively low throughput as only one wafer at a time can be processed. Further, the multiple wafer horizontal designs pose extreme difficulties in connection with the incorporation of automatic robotic wafer loading and unloading. Also, horizontal multiple wafer designs can process only a limited number of wafers before the chamber becomes so large in area as to become very difficult to maintain the necessary plasma uniformity and necessary gas flow control.

SUMMARY OF THE INVENTION

It is therefore an object of the present invention to provide a PECVD chamber that can process multiple wafers in a uniform enhanced plasma environment.

It is a further object of the present invention to provide a PECVD chamber having facility for automatic robotic loading and unloading of wafers.

It is a still further object of the present invention to provide a PECVD chamber system including apparatus for transmitting RF energy to a rotating wafer boat having wafers held horizontally in a vertically spaced array, causing a glow discharge, and thereby enhanced plasma over a surface of each wafer.

Briefly, a preferred embodiment of the present invention includes a plasma enhanced chemical vapor deposition (PECVD) system having an upper chamber for performing a plasma enhanced process. and a lower chamber having an access port for loading and unloading wafers to and from a wafer boat. The system includes apparatus for moving the wafer boat from the upper chamber to the lower chamber. The wafer boat includes susceptors for suspending wafers horizontally, spaced apart in a vertical stack. An RF plate is positioned in the boat above each wafer for generating an enhanced plasma. A novel RF connection is provided, allowing the RF energy to be transmitted to the RF plates while the wafer boats are rotated. In addition, apparatus for automatic wafer loading and unloading is provided, including apparatus for lifting each wafer from its supporting susceptor, and a robotic arm for unloading and loading the wafers.

IN THE DRAWING

DETAILED DESCRIPTION OF THE PREFERRED EMBODIMENT

Figure 1:
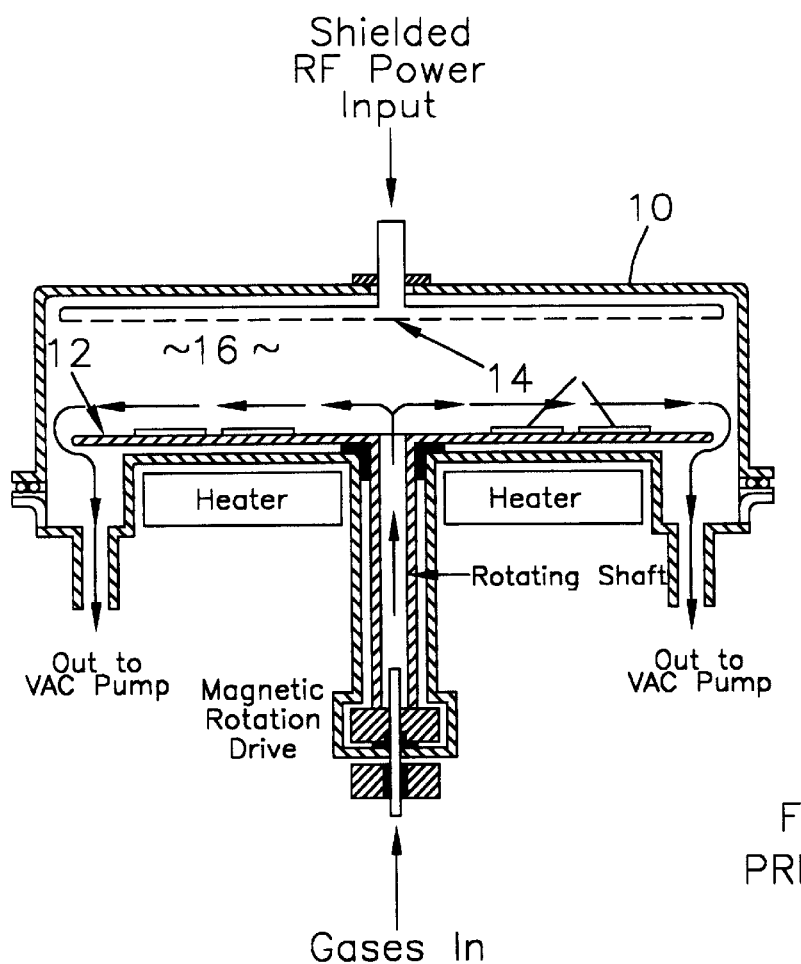
FIG. 1 shows a prior art rotating susceptor chamber.
Figure 2:
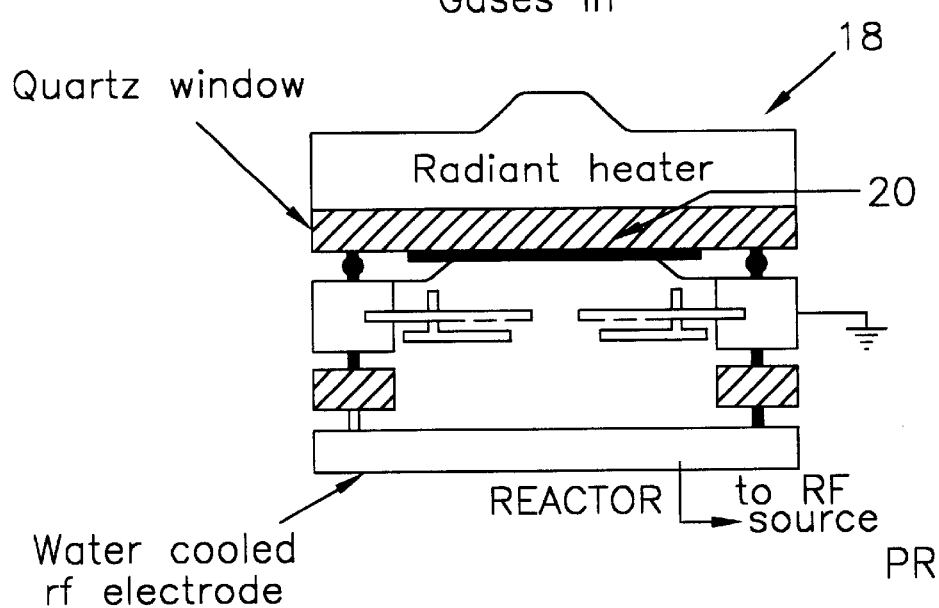
FIG. 2 is a prior art chamber with a stationary wafer.
Figure 3:
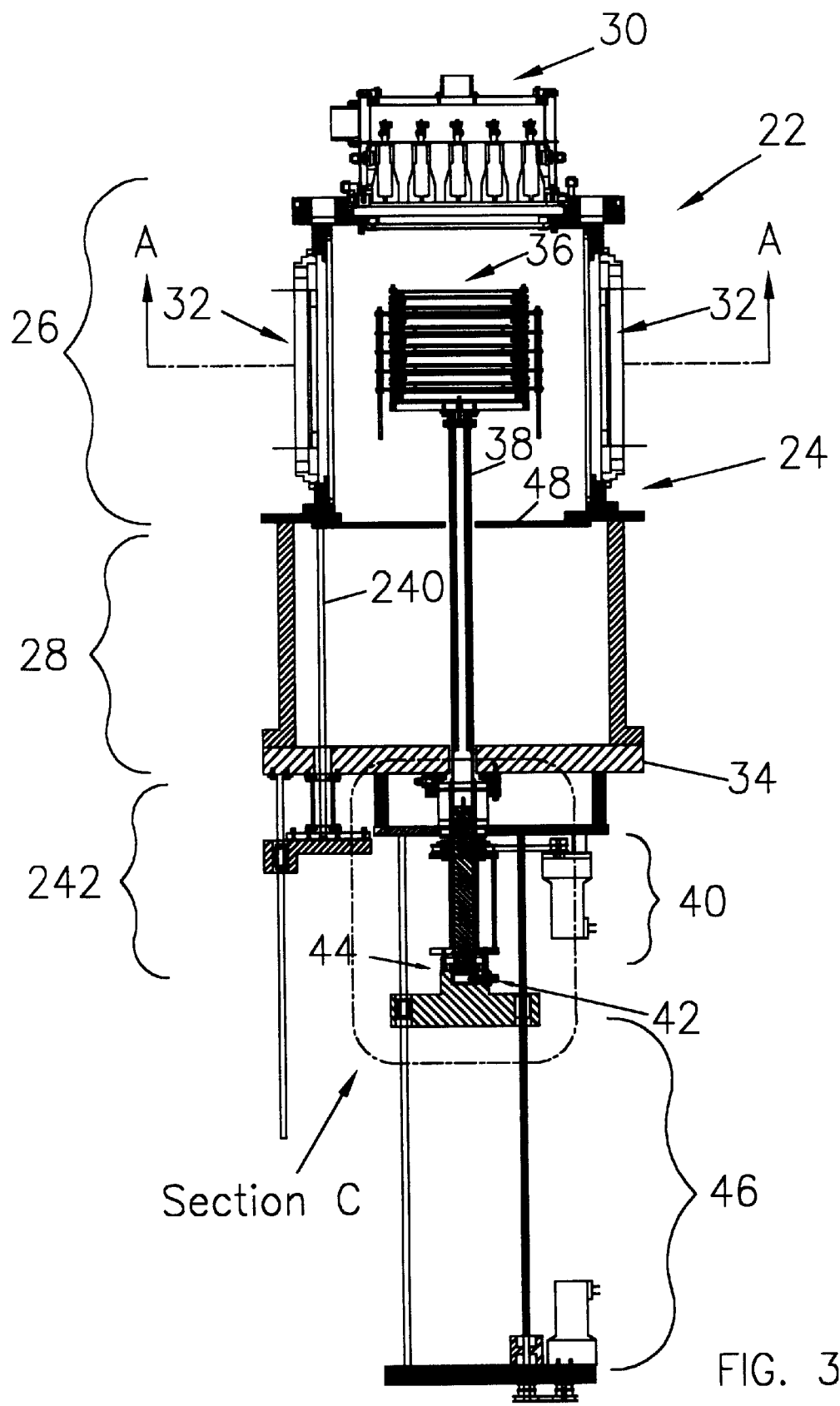
FIG. 3 illustrates a preferred embodiment of the present invention.

Referring now to FIG. 3 of the drawing, a preferred embodiment 22 of the PECVD chamber system of the present invention is shown. An enclosure 24 has an upper chamber 26 and a lower chamber 28. The upper chamber has an optional radiant top heater 30, and optional side heaters 32. for use when the process requires temperatures above room temperature. A bottom heater (not shown) can also be attached, for example to plate 34 as described in U.S. patent application Ser. No. 08/909,461 entitled Mini-Batch Process Chamber, the contents of which are included herein by reference.

The wafer boat 36 includes susceptors for holding wafers horizontally, in a stacked, spaced apart array. The boat 36 includes a RF plate positioned above each wafer, for causing a glow discharge creating an enhanced plasma above each wafer. The wafer boat, in cooperation with other chamber system 22 apparatus, includes apparatus for automatically lifting each wafer from its susceptor for loading and unloading by a robotic arm when the boat is lowered into the lower chamber 28. The boat 36 is supported on a rotatable shaft structure 38, rotated by a rotation mechanism 40. The RF energy is transmitted to the RF plate by way of a transmission line through the shaft structure. (RF refers to all types of RF power, including dual frequency RF and pulsed RF.) The transmission line is coupled to an RF connector 42 by way of a rotating contact joint 44. The rotating contact 44 allows the RF energy to be transmitted while the boat 36 is rotated, a novel feature providing more uniform processing over a wafer surface. The vertical motion of the shaft 38 and boat 36 is accompanied by a lift mechanism 46. Further details of the rotation mechanism 40 and lift mechanism 46 are included in U.S. Patent Ser. No. 08/090,461. A seal plate 48 prevents reactant gases from the upper chamber from passing into the lower chamber 28 during processing, and thereby minimizing unwanted deposition of material in the lower chamber. In order to assure minimal transfer of reactant gas from the upper chamber 26 to the lower chamber 28, an inert gas at a low level positive pressure is injected into the lower chamber 28. This operation, and the associated apparatus details of the movement of plate 48 when the boat is lowered into the lower chamber 28 are fully explained in U.S. patent application Ser. No. 08/909,461. The details of construction and operation of the present invention including the boat 36, the rotating contact 44, and the automatic loading and unloading mechanism will all be fully explained in the following text of the specification in reference to the various figures of the drawing.

Figure 4:
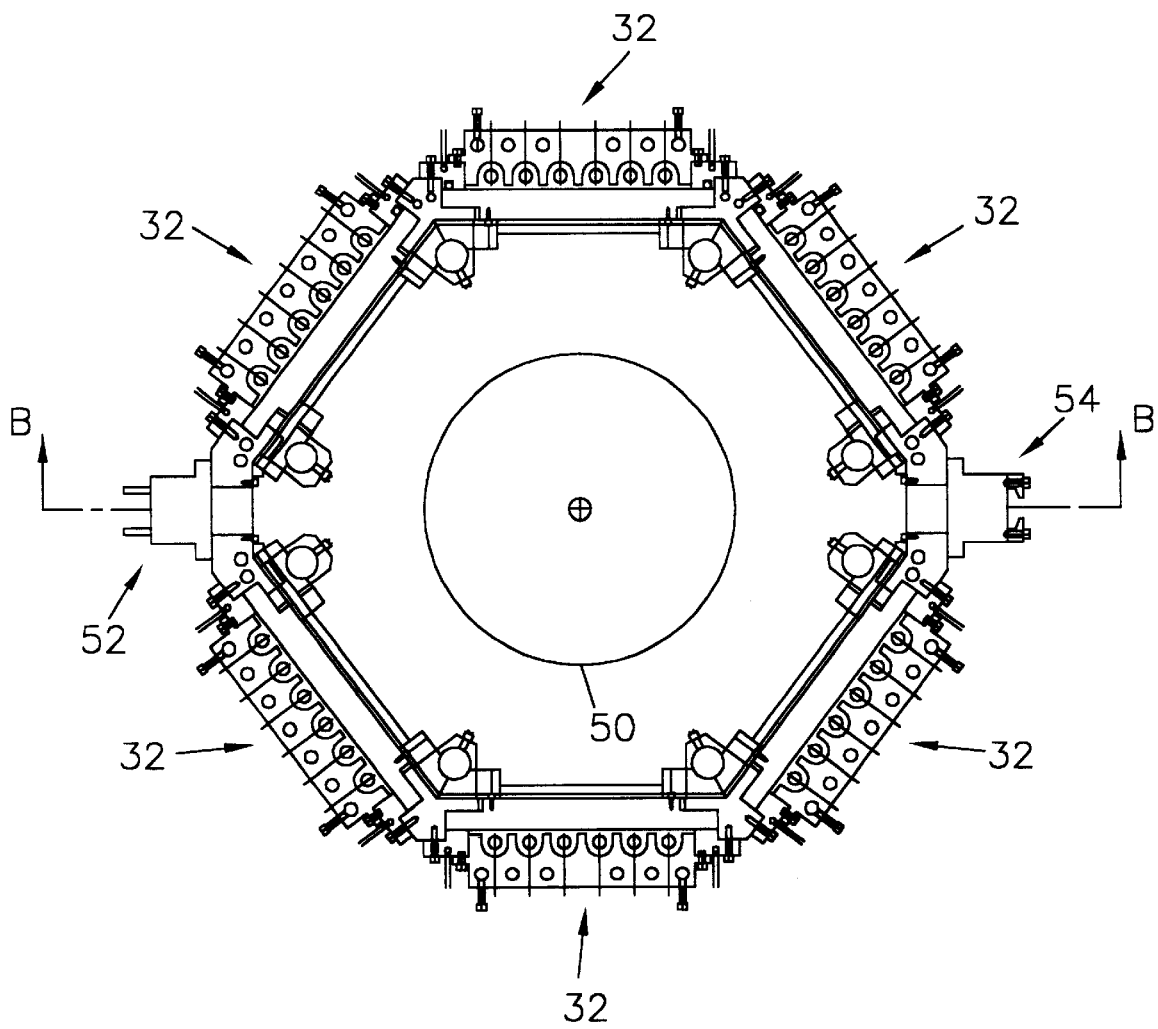
FIG. 4 is a top cross-sectional view of the upper chamber of the reactor of FIG. 3.
Figure 5:
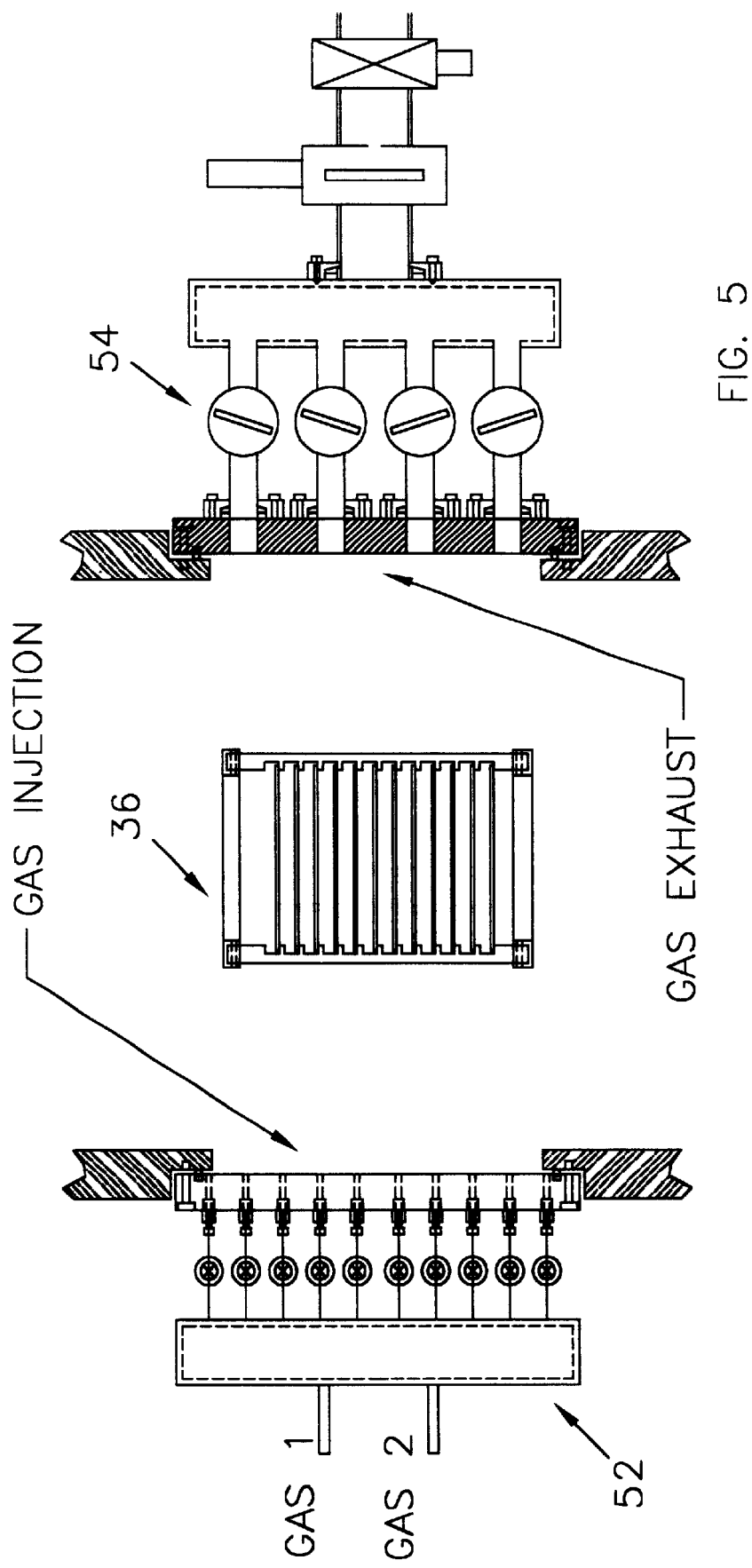
FIG. 5 shows a vertical cross-sectional view of the upper chamber.

FIG. 4 is a top cross section of the upper chamber 26, showing six side heater assemblies 32. In operation, wafers 50 are rotated while gases enter the chamber 26 via a gas injection manifold 52 and are exhausted on the other side via an exhaust manifold 54. FIG. 5 is a vertically cross sectioned view of the upper chamber 26 showing further detail of the tunable gas injection manifold 52 and the opposing tunable exhaust manifold 54 with the rotating wafer boat 36 in between.

Figure 6:
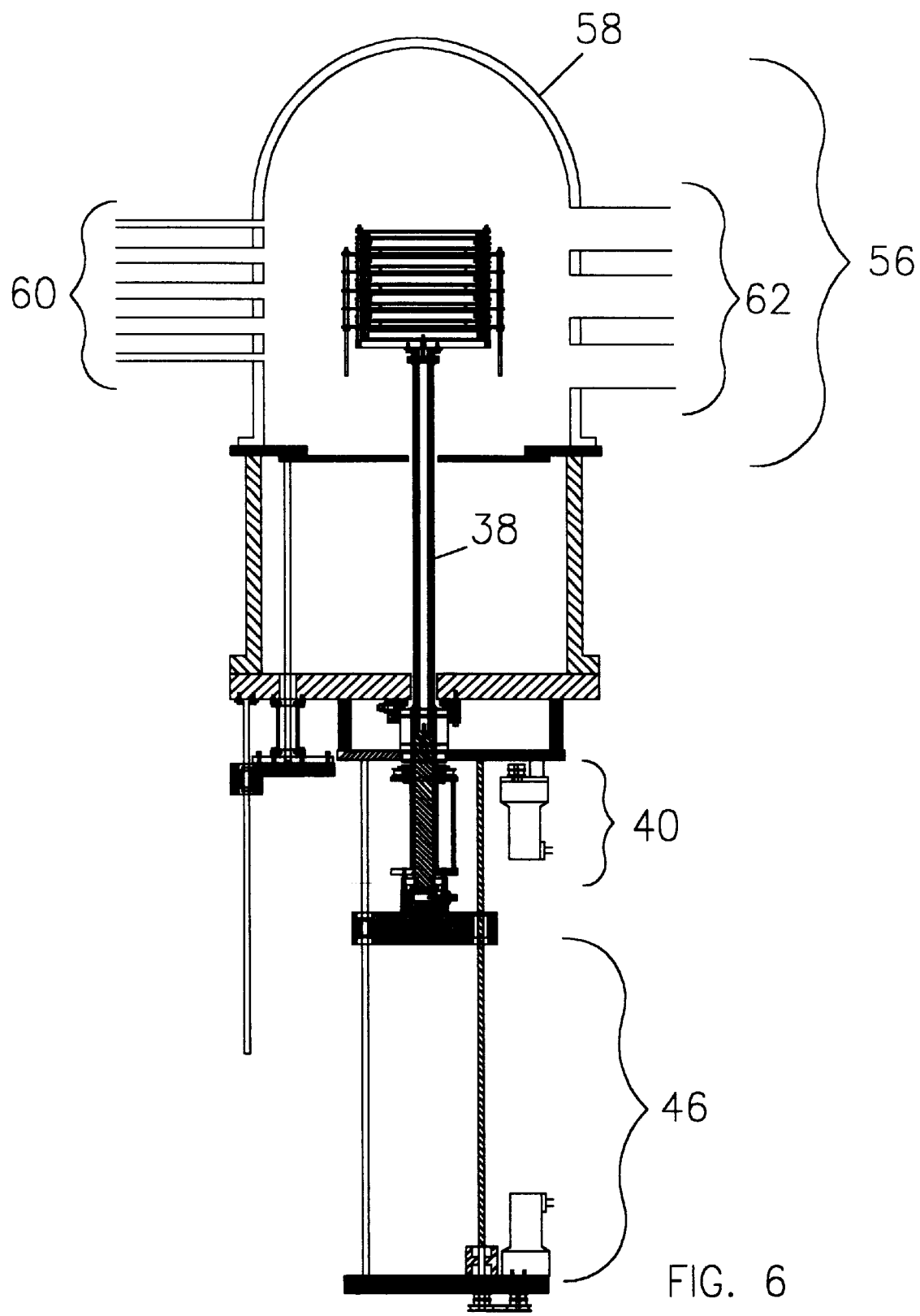
FIG. 6 shows an alternate construction of an upper chamber constructed in the form of a bell jar.

FIG. 6 shows an alternate construction 56 for the upper chamber 26 of FIG. 3, where the upper portion is a simple bell jar 58 made of suitable material such as quartz or silicon carbide. Gas injection is accomplished via inlet tubes 60 and exhausted via exhaust tubes 62. Optional radiant heaters or resistive heating elements can be arranged about the upper chamber 56 for processes above room temperature.

Figure 7:
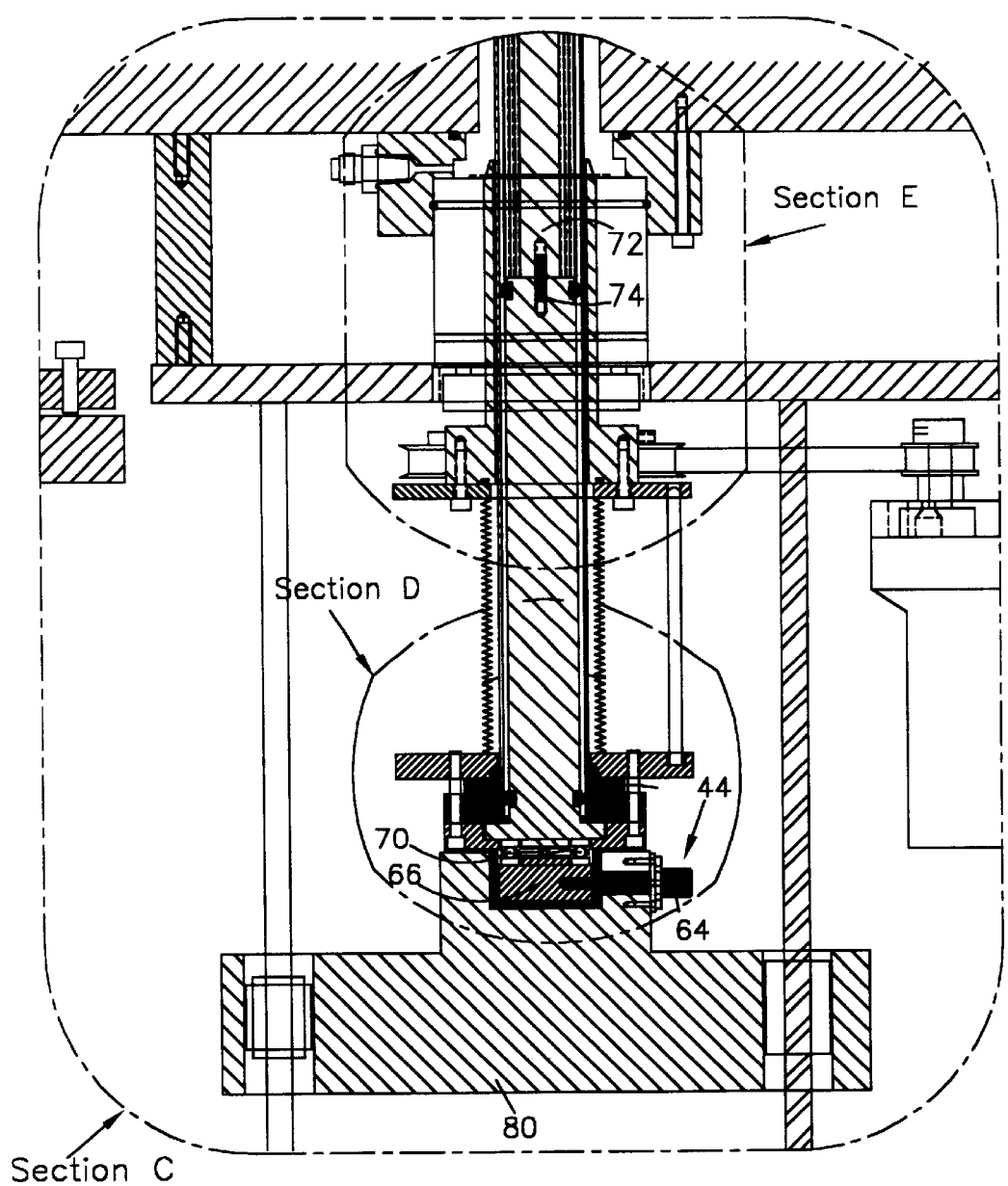
FIG. 7 is an enlargened section C from FIG. 3 showing detail of the rotating RF input assembly.
Figure 8:
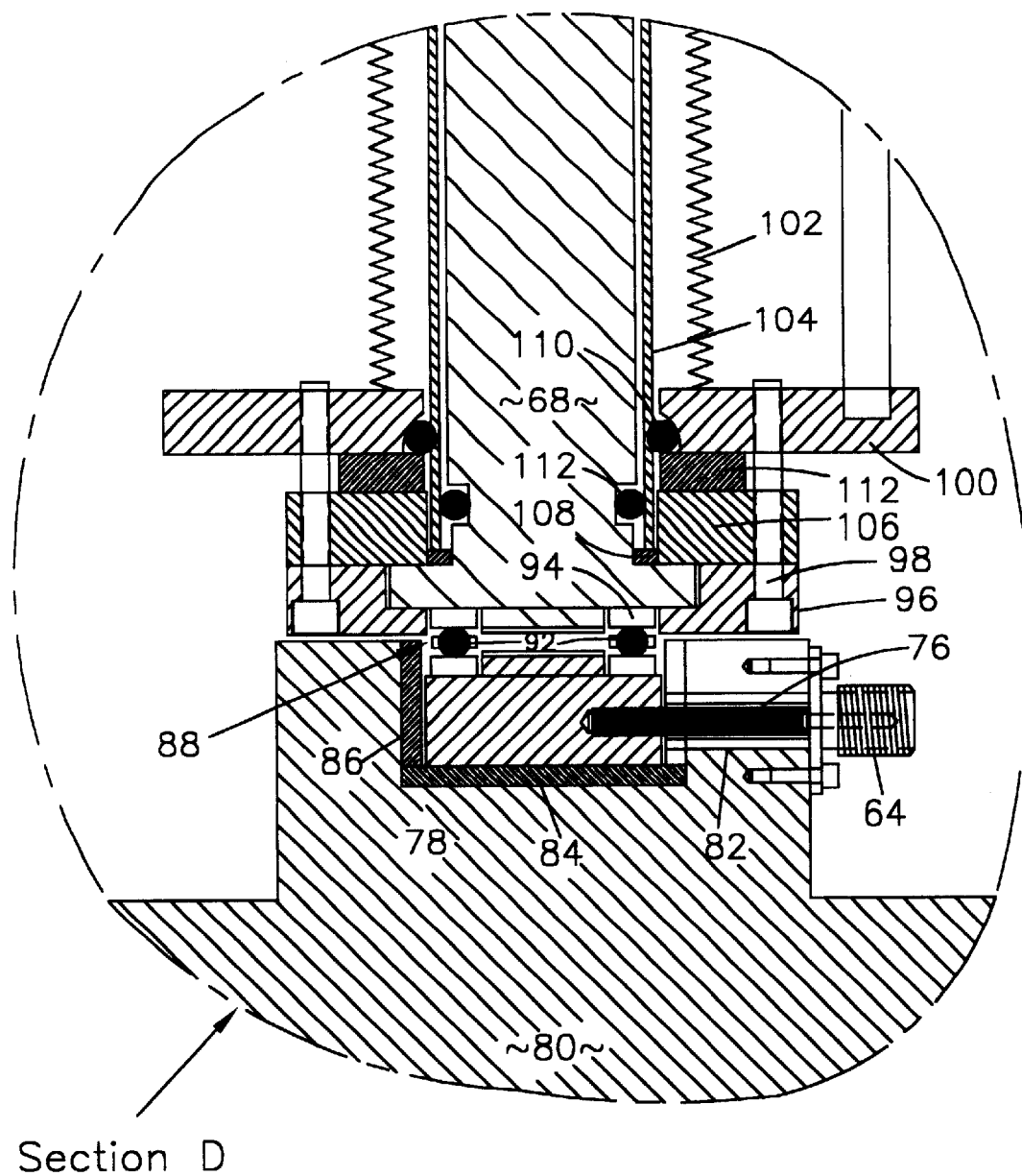
FIG. 8 is a further enlargement of section D of FIG. 7, clarifying the detail of the rotating RF connection.

FIG. 7 shows the rotating RF input assembly 44 where the RF energy is introduced via connector 64 to a stationary bottom RF disk 66. The RF is coupled to a lower RF shaft 68 via a metal thrust bearing 70. The RF is then in turn connected to an upper RF shaft 72 via a threaded rod 74. FIG. 8 is a section D blow up of the RF input assembly 44 showing an RF connector 64 which makes contact to a threaded rod 76 which in turn is threaded into the stationary bottom RF disk 78. To avoid electrical contact with the lift carriage 80. the threaded rod 76 is surrounded by an insulating tube 82 made from suitable insulating material such as ceramic or plastic. To keep the stationary bottom RF disk 78 from contacting the lift carriage 80, an insulating disk 84 supports the bottom of RF disk 78 and an insulating tube 86 electrically isolates the sidewalls of RF disk 78. The RF energy passes through a metal thrust bearing 88 first via bottom race 90, then through the rotating balls 92 and finally to the upper race 94 which is in contact with bottom RF shaft 68. The bottom RF shaft 68 is secured via insulating clamp ring 96 and bolts 98 to the bottom bellows disk 100 which has bellows 102 welded to its upper surface. A metal tube 104 which is a ground potential surrounds the bottom RF shaft 68 and is held in place via tube clamp 106 made from insulating material such as Delrin. To prevent electrical contact to the bottom RF shaft 68, the bottom of metal tube 104 is isolated via insulating ring 108. O-ring 110 in conjunction with metal washer 112 forms the vacuum seal between the metal tube 104 and the bottom bellows disk 100. O-ring 112 forms the internal vacuum seal between the bottom RF shaft 68 and the metal tube 104. This O-ring 112 also aligns the bottom RF shaft 68 to be parallel to the metal tube 104 and at the same time provides a small gap of about 0.05" in between which prevents electrical contact and acts as a "dark space" which precludes the occurrence of a glow discharge or plasma within the gap.

Figure 9:
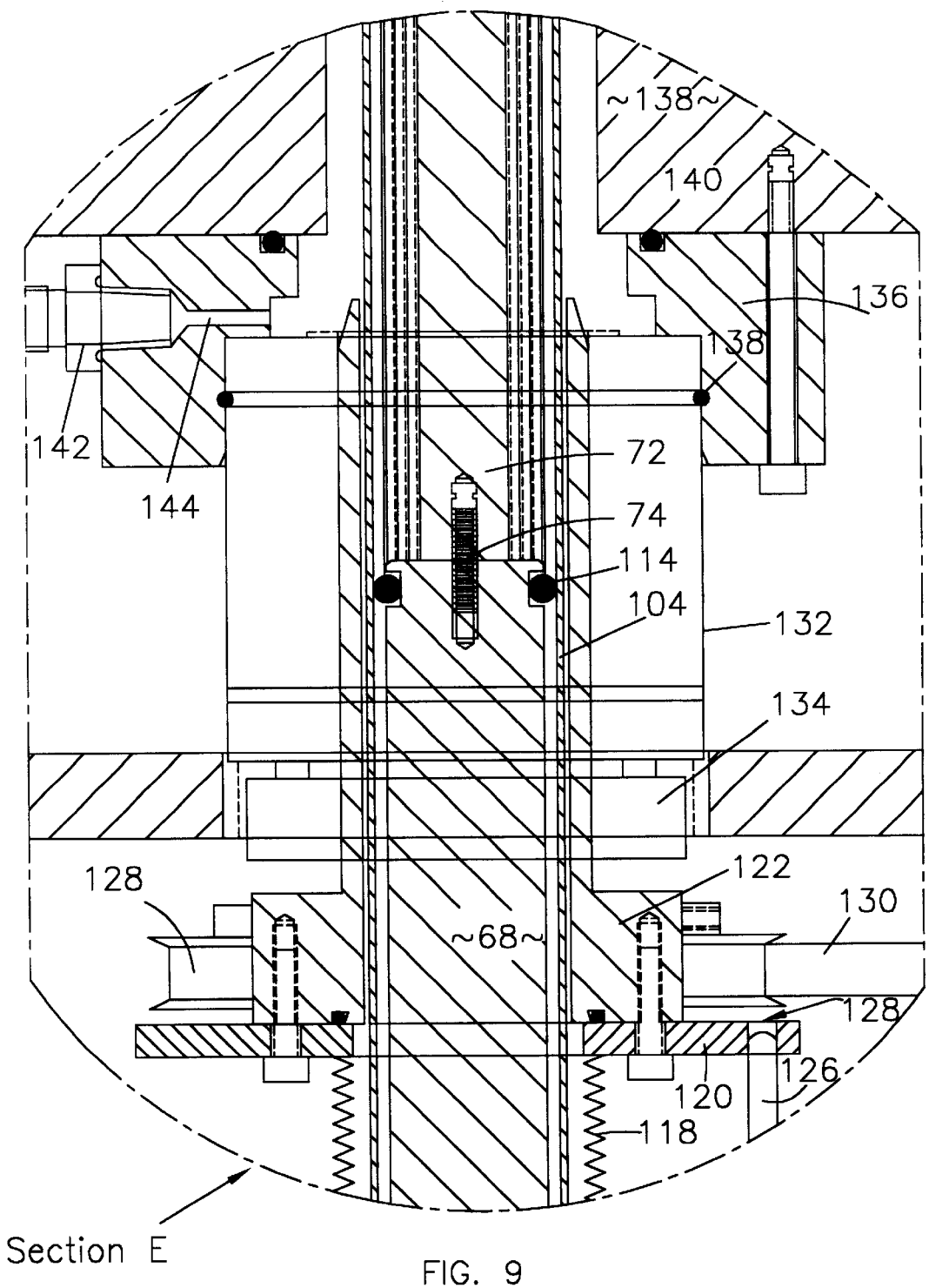
FIG. 9 is an enlargement of section E of FIG. 7. showing the upper portion of the bottom RF shaft.

FIG. 9, section E of FIG. 7. shows the upper portion of bottom RF shaft 68. An O-ring 114 further maintains the parallelism and the dark space gap between the bottom RF shaft 68 and the metal tube 104. The upper RF shaft 72 is connected to the lower RF shaft 68 via wazzu threaded rod 74. The space between the upper RF shaft 72 and the metal tube 104 is filled with insulating material to prevent the occurrence of a plasma. The insulating material is in the form of three concentric standard size quartz tubes 116. The upper end of bellows 118 is welded to an upper bellows disk 120 and vacuum sealed to an outer rotation tube 122 via O-ring 124. When the lift carriage 80 (FIG. 7) is in the up position, two or three rods 126 (only one shown for clarity) engage into holes 128 drilled into upper bellows disk 120 so that the rotational force is transmitted via the rods 126 to prevent contortion of the bellows 118. Pulley 128 is affixed to the outer rotation tube 122 and drive belt 130 goes to a pulley on the rotation motor. Outer rotation tube 122 passes through a ferrofluidic rotary vacuum seal 132 and is held in place via tube clamp 134. The ferrofluidic seal 132 is itself vacuum sealed to the feedthrough flange 136 via O-ring 138.

The feedthrough flange 136 is sealed to the chamber bottom plate 138 via O-ring 140. A fitting 142 leads to hole 144 so that inert gas may be injected to prevent process gases from entering the space between the metal tube 104 and the bottom plate 138 and the feedthrough flange 136.

The details of construction of the wafer boat 36 will now be fully described in reference to FIGS. 10–17.

Figure 10:
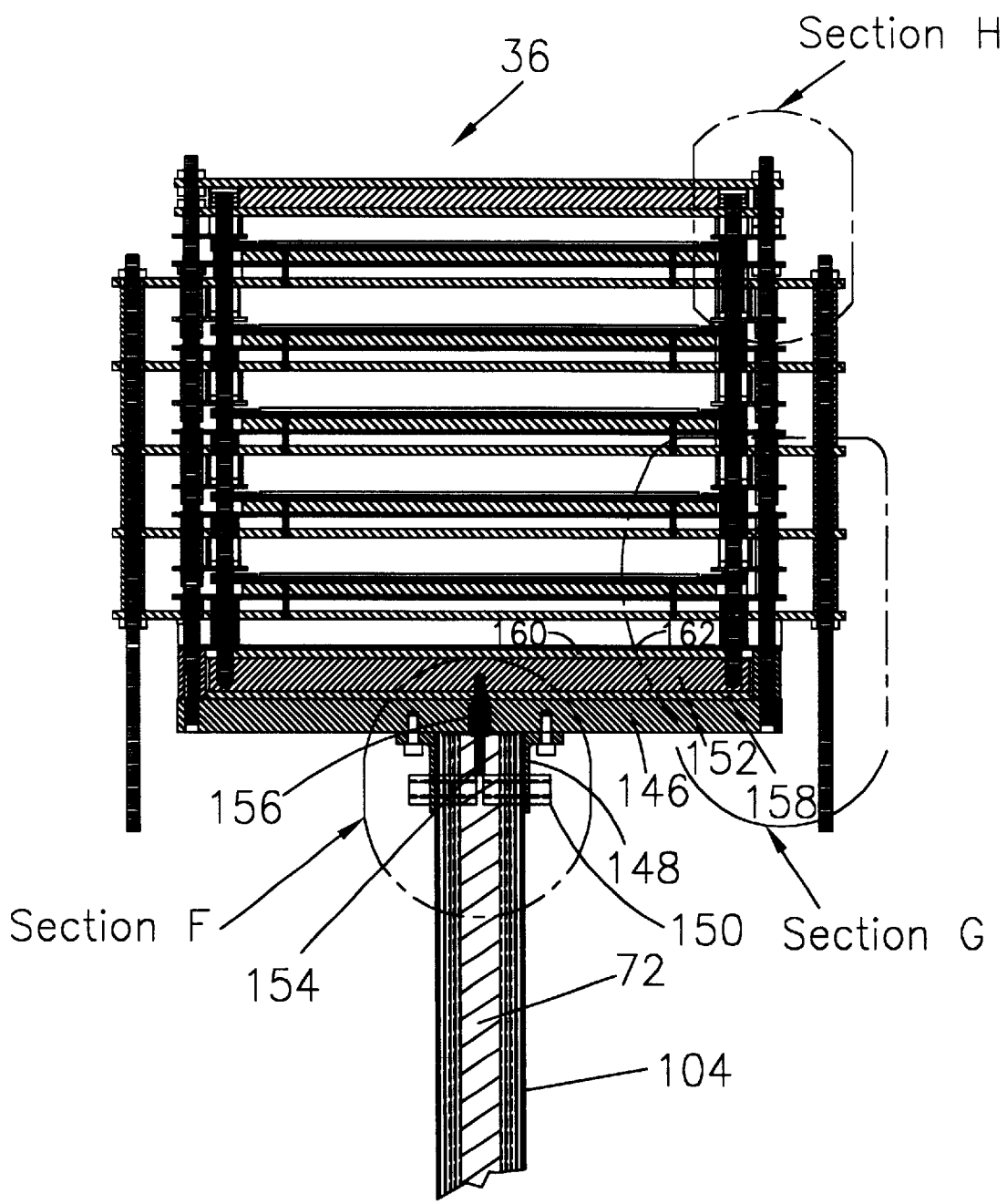
FIG. 10 shows further detail of the wafer boat.
Figure 11:
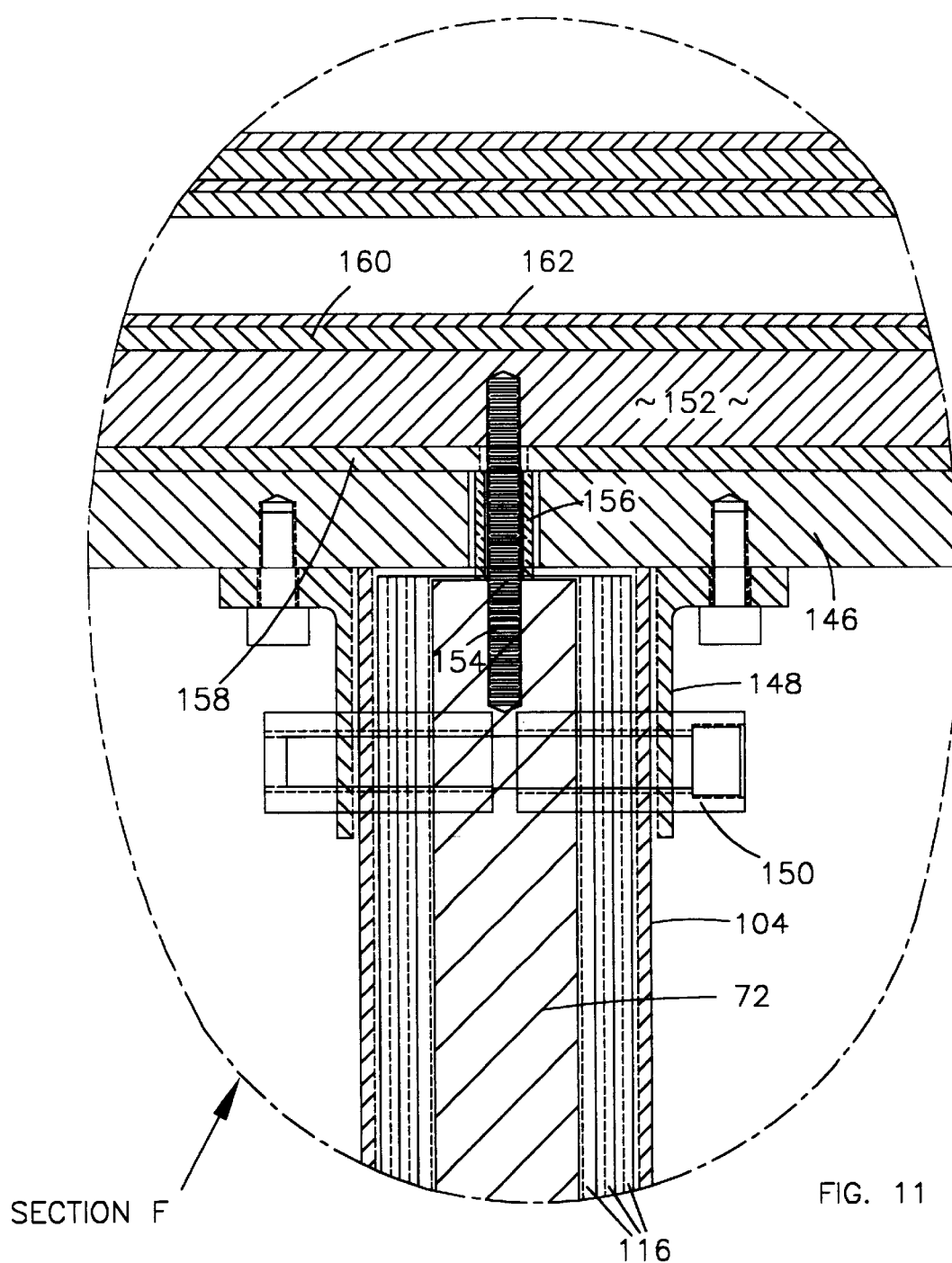
FIG. 11 is an enlargened view of section F of FIG. 10.

FIG. 10 shows the wafer boat 36, wherein the upper end of metal tube 104 is connected to a boat bottom plate 146 via slitted flange 148 and secured in place to flange 148 via clamp ring 150. Upper RF shaft 72 is connected to the bottom RF plate 152 via threaded rod 154. A section F is shown in FIG. 11, enlarged for a more clear illustration of the following detail. To prevent electrical contact and/or the occurrence of a plasma, insulating tube 156 made from ceramic or other suitable material is inserted between the boat bottom plate 146 and the threaded rod 154. Further isolation between the boat bottom plate 146 and the bottom RF plate 152 is provided by insulating disk 158. To prevent a plasma from occurring in the space above the bottom RF plate 152, a second insulating disk 160 is sandwiched between the bottom RF plate 152, and a metal disk 162.

Figure 12:
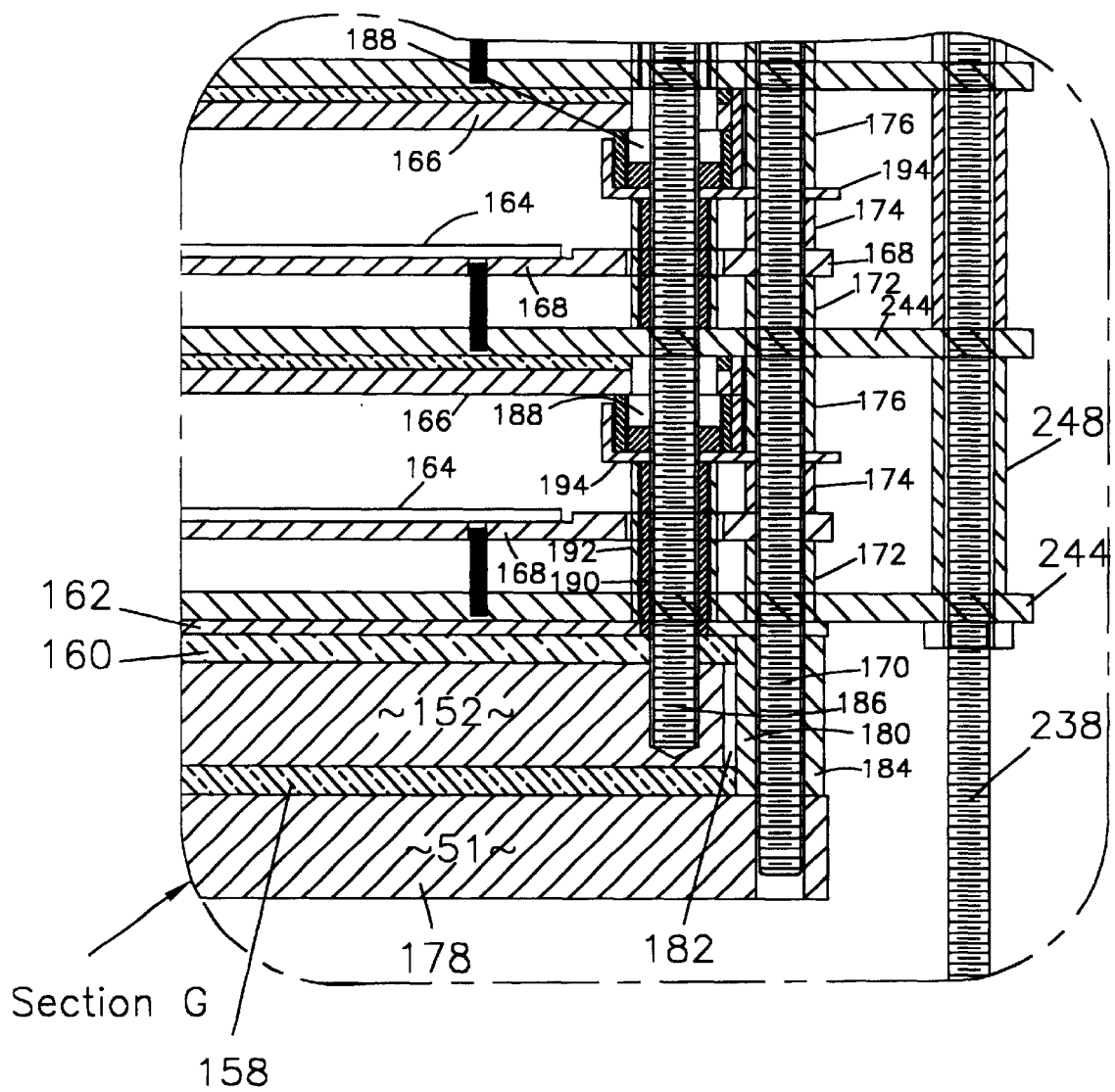
FIG. 12 is an enlargened view of section G of FIG. 10 showing further detail of the wafer boat.

FIG. 12 is an enlargement of the structure of section G of FIG. 10. The wafer boat 36 is configured so that wafers 164 are at ground potential or electrically floating. The plasma is generated above the wafers 164 via RF plates 166. Wafer susceptors 168 are held in place via threaded rod 170 and conductive spacers 172, 174, and 176 made from suitable material such as metal or graphite. In the event that the wafer susceptors 168 are made of conductive material, the wafers 164 will be at ground potential. If the wafer susceptors 168 are made from insulating material, the wafers 164 will be floating. The rods 170 are threaded into the boat bottom plate 178 and metal band 180 surrounds the bottom RF plate 152 with insulating disks 158 and 160 holding the band slightly away from the bottom RF plate 152 to form a dark space gap 182. Outer metal band 184 provides further structural support. The RF energy is transmitted up from the bottom RF plate 152 via threaded rod 186 which contacts the RF plates 166 via nuts 188. To prevent the occurrence of a plasma around the threaded rod 186, insulating tubes 190 surround the threaded rod 186. The insulating tubes 190 are in turn surrounded by conductive tubes 192 which connect to ground potential via conductive shield disks 194 and conductive spacers 174 and 176 and the threaded rod 170.

Figure 13:
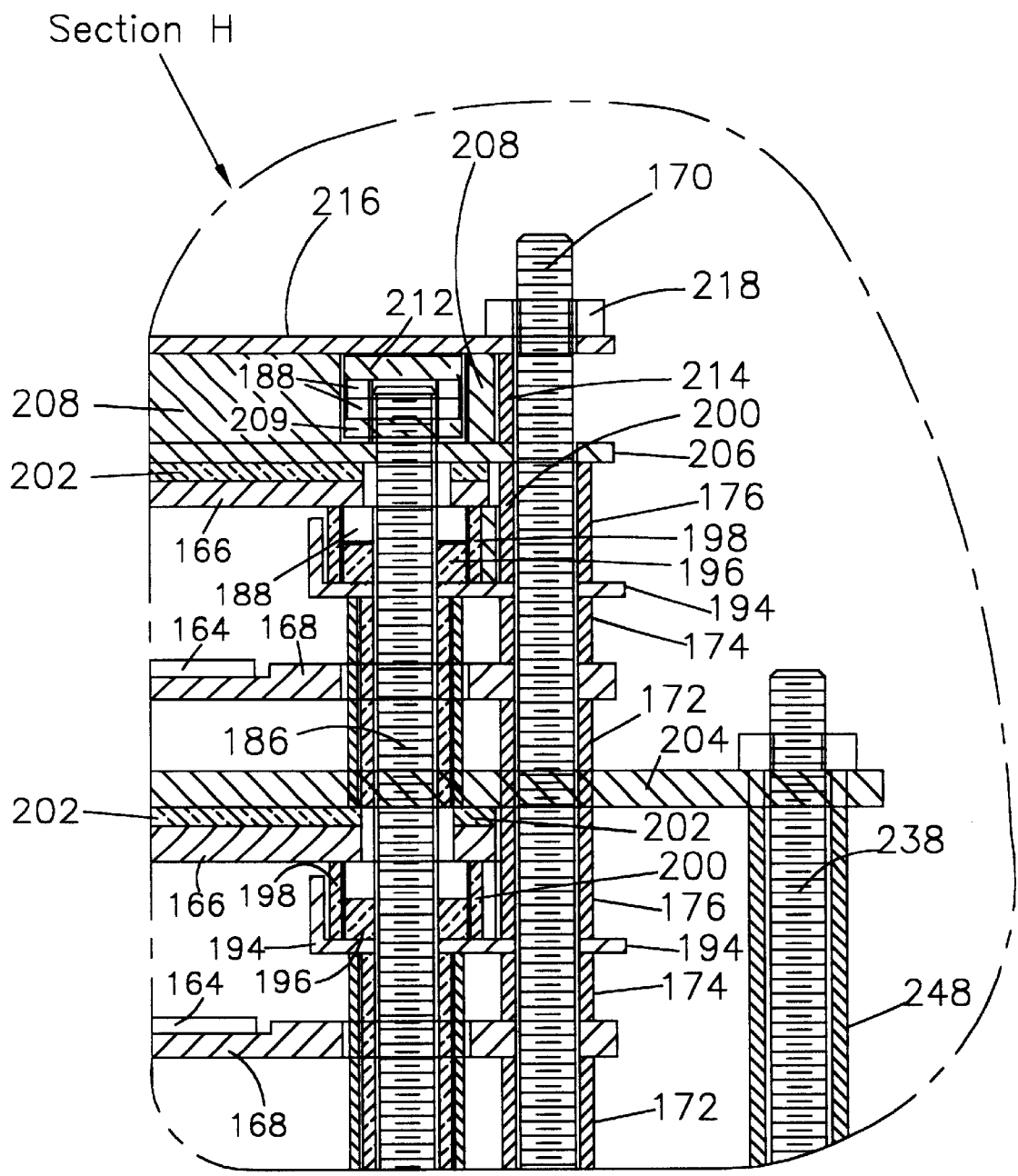
FIG. 13 is an enlargened view of section H of FIG. 10 showing the upper right hand portion of the boat.

FIG. 13 is an enlargened view of Section H of FIG. 10, showing the upper right-hand portion of boat 36. To prevent contact of the conductive shield disks 194 to the RF energized nuts 188, insulating washers 196 are placed between them and insulating tubes 198 surround the nuts 188. The conductive shield disks 194 are shaped along their inside diameters to capture the insulating tubes 198 and come to within a dark space distance to the RF plates 166. To prevent the occurrence of plasma around the outside edge of RF plates 166, a conductive band 200, which is connected to ground potential via conductive shield disks 194, is positioned around the entire periphery of RF plates 166. Insulating plates 202 are positioned on top of RF plates 166 to prevent the occurrence of plasma above the RF plates 166. During processing, grounded lift plates 204 rest upon the insulating plates 202. The lift plates 204 function to lift the wafer during robotic loading and unloading as further described later herein. At the top of the boat 36, the uppermost insulating plate 202 has a grounded conductive disk 206 resting on top of it. Positioned above the grounded conductive disk 206 is an insulating disk 208 which has holes 210 drilled through it near the periphery to capture the top end of RF threaded rod 186 and the nuts 188. Before the nuts 188 are threaded onto the RF rod 186, insulating washers 209 are placed into the holes 210. On top of the nuts 188 are insulating disks 212. A grounded conductive band 214 surrounds the periphery of disk 208 and a second grounded conductive disk 216 is positioned above the insulating disk 208 after which a nut 218 is threaded onto grounded threaded rod 170.

Figure 14:
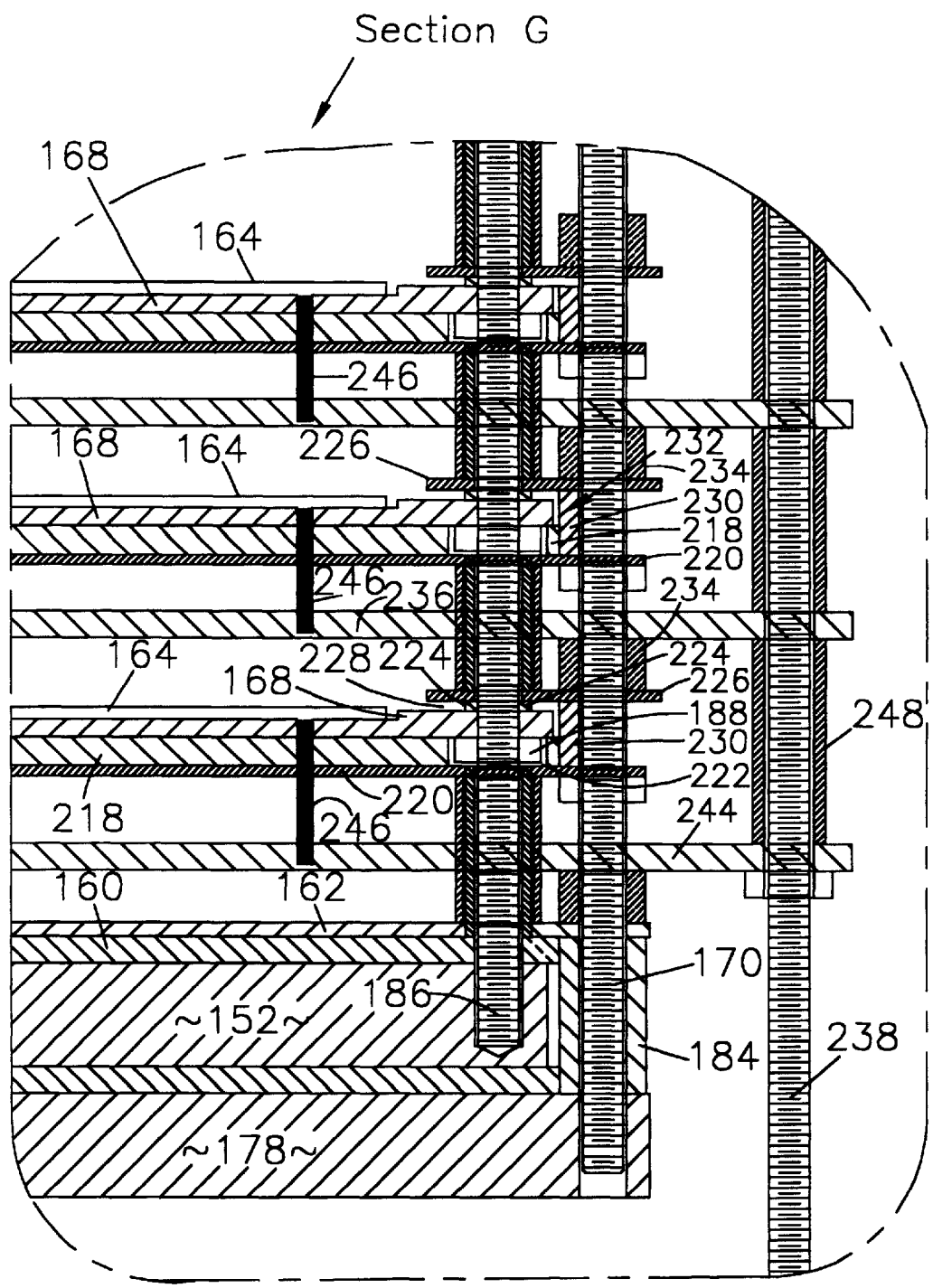
FIG. 14 is an enlargened view of section G of FIG. 12, except showing a modified construction.

FIG. 14 is an enlarged view of section G of FIG. 12, except showing a modified construction for boat 36 where the wafer susceptor 168 is powered with RF energy as opposed to the configuration of FIG. 13 where plate 166 above the wafer was RF energized. In this case, the energized susceptor 168 is connected to the RF rod 186 via nuts 188. The bottom of the susceptor is insulated to prevent a plasma on the bottom side by insulating disk 218 which rests upon grounded conductive disk 220 and which has through holes drilled therein to capture nuts 188. The thickness of insulating disk 218 is such to allow only a small dark space gap 222 between the grounded conductive disk 220 and the nut 188. Insulating washers 224 have a thickness of approximately 0.04" to 0.07" and hold the dark space grounded disks 226 above the susceptor to leave a small enough gap 228 as to preclude a plasma from occurring in this region. Surrounding the periphery of susceptor 168 is a grounded conductive band 230 with spacing 232 in between such as to preclude a plasma around the periphery of susceptor 168. Spacers 234 keep grounded lifting disks 236 at the desired spacing above the wafers 164 top surface. The top of this type of boat 236 has construction similar to that of FIG. 13 to insulate and preclude a plasma from occurring anywhere except in the desired region of wafers 164.

Figure 15:
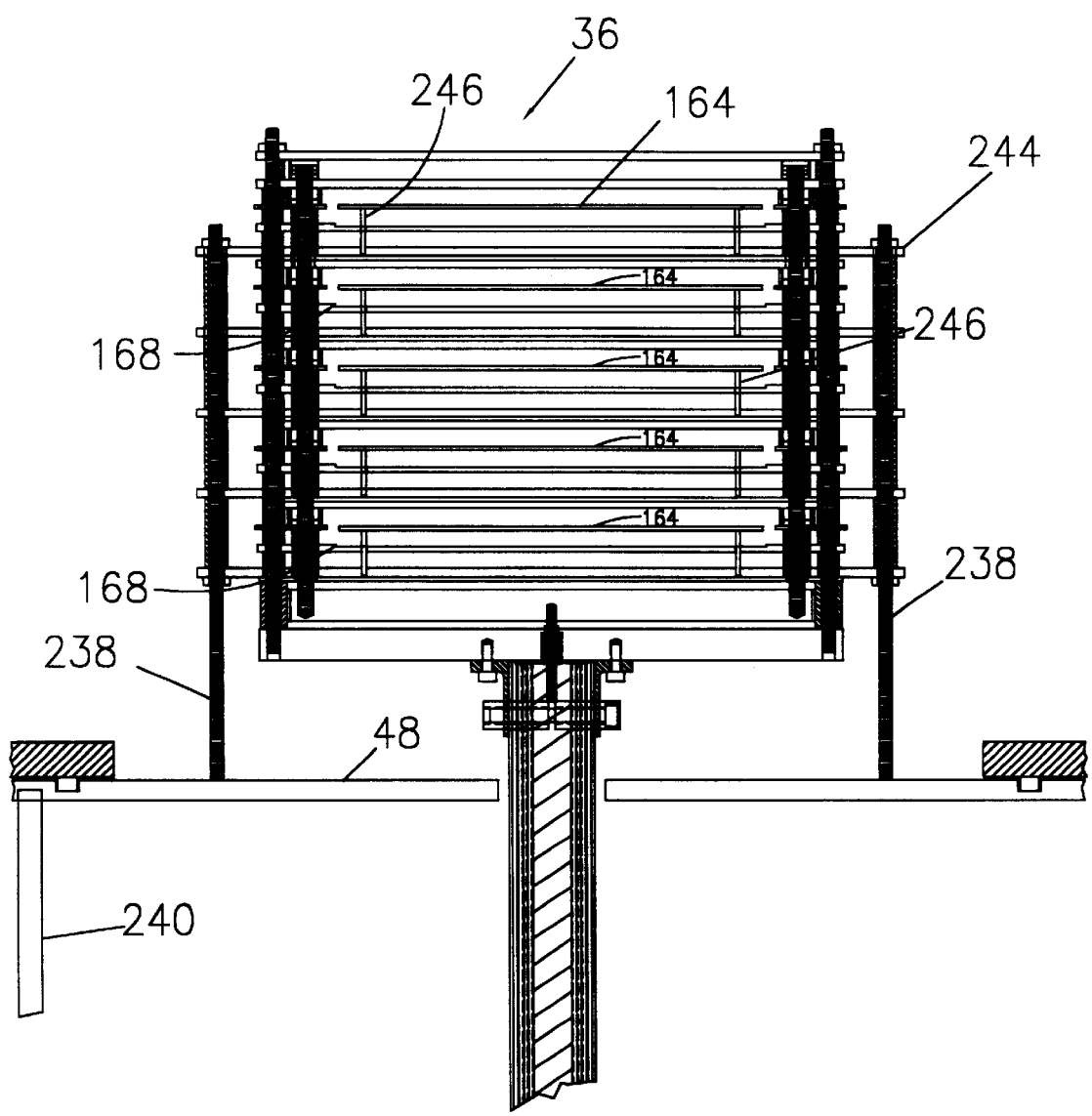
FIG. 15 shows the wafer boat in contact with the moveable plate.
Figure 16:
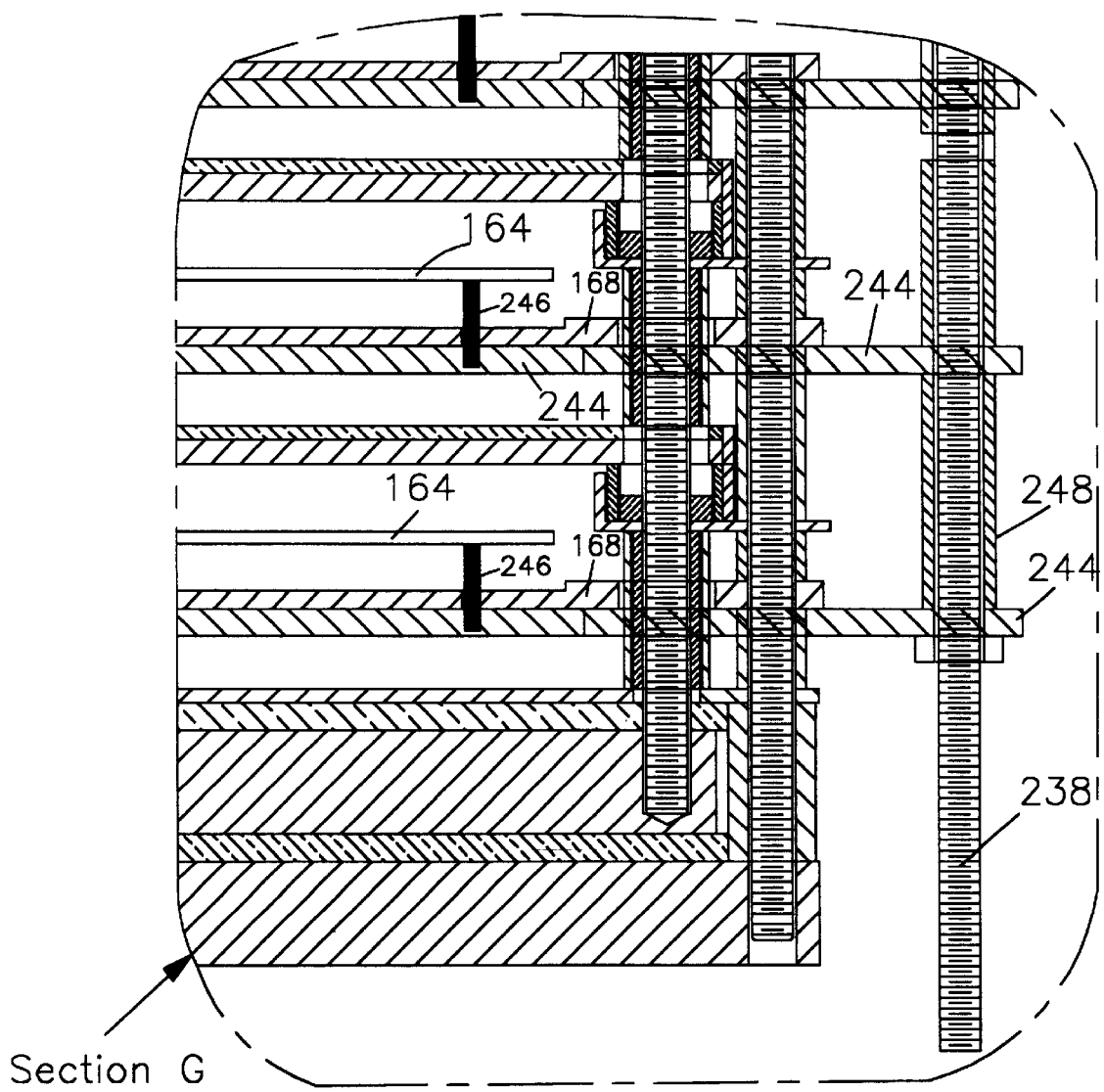
FIG. 16 shows details of lifting wafers off of their susceptors for an embodiment wherein RF energy is applied to plates above the wafers.
Figure 17:
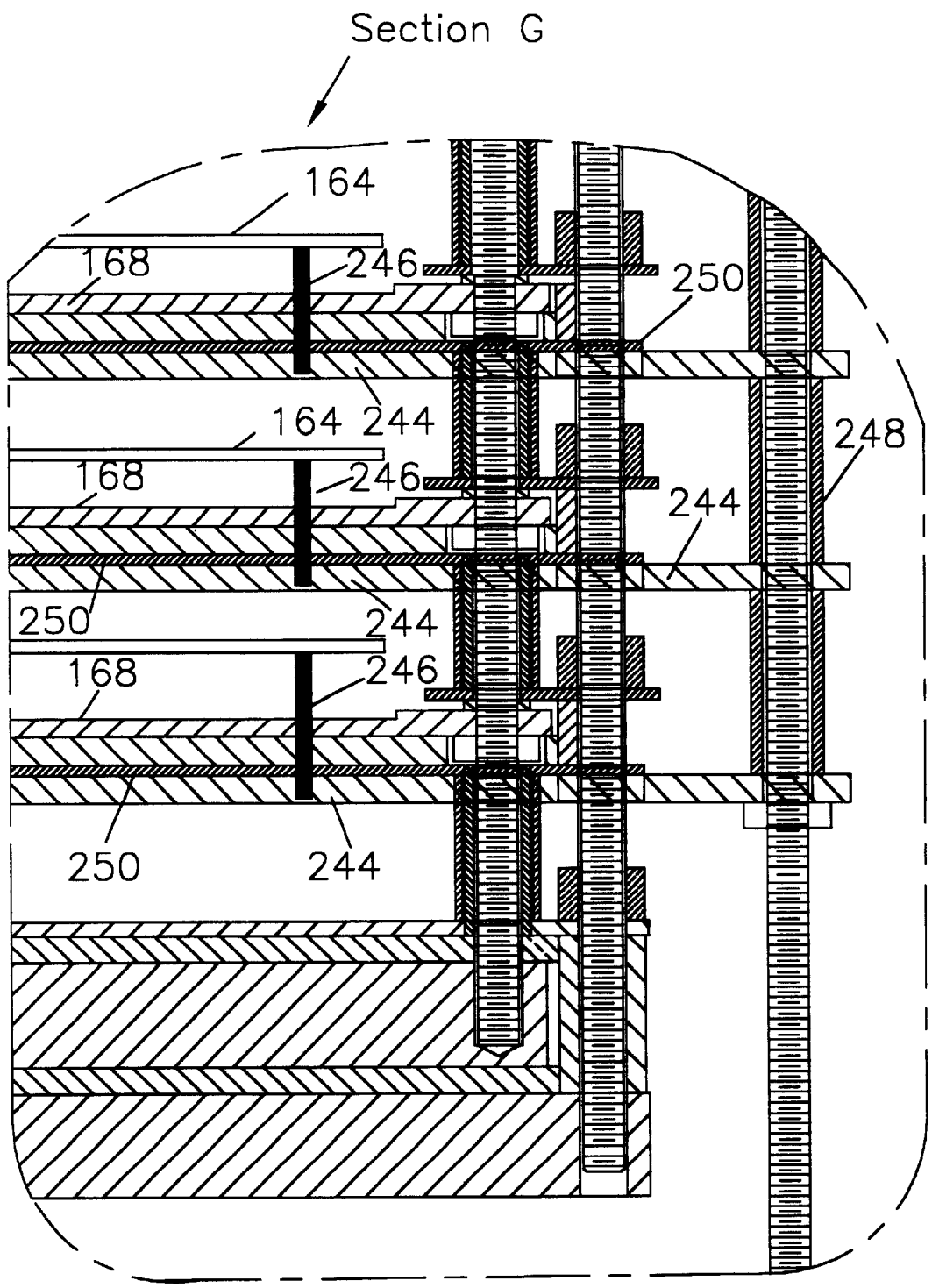
FIG. 17 shows details of lifting wafers off of their susceptors for an embodiment wherein RF energy is applied to the susceptors.

The following describes an apparatus for automatic robotic loading and unloading of wafers 164 into and out of boat 36. As shown in FIGS. 12 and 14, wafers 164 are resting on top of susceptors 168 when the boat 36 is in the up position within the upper chamber 26 of the reactor 22, as shown in FIG. 3. As the boat 36 is lowered down into the load/unload lower chamber 28 of the reactor 22, lift rods 238 come in contact with the movable plate 48 as shown in FIG. 15. The plate 48 is supported by three rods 240 of which only one is shown in FIGS. 3 and 15 for clarity. The rods 240 are made movable and vacuum sealed via three vertical motion mechanisms 242 shown in FIG. 3. (See U.S. patent application Ser. No. 08/909,461 for details of the mechanisms 242). The mechanisms 242 may be motorized or effected with constant upward force via the combination of the force of the bellows counteracted by the force of a downward pulling constant force spring. Once the lift rods 238 contact plate 48, continued downward motion of boat 36 causes the rods 238 to move upwards relative to the rest of boat 36 causing lift plates 244 to move up, which in turn causes the lift pins 246 to move upwards lifting wafers 164 off of the susceptors 168 as shown in more detail in FIG. 16 for the case of where the RF energy is applied during processing on plates above the wafers 164 and in FIG. 17 for the case where the RF energy is applied to the susceptors 168. The lift plates 244 are vertically spaced apart via spacers 248 (FIGS. 16 & 17) at a predetermined distance. FIG. 16 shows that the upward motion of lift plates 244 stops relative to the rest of the boat 36 when the lift plates 244 come in contact with the bottom of the susceptors 168. In FIG. 17 the lift plates 244 stop moving upward when the lift plates 244 come in contact with the grounded disk 250.

Figure 18:
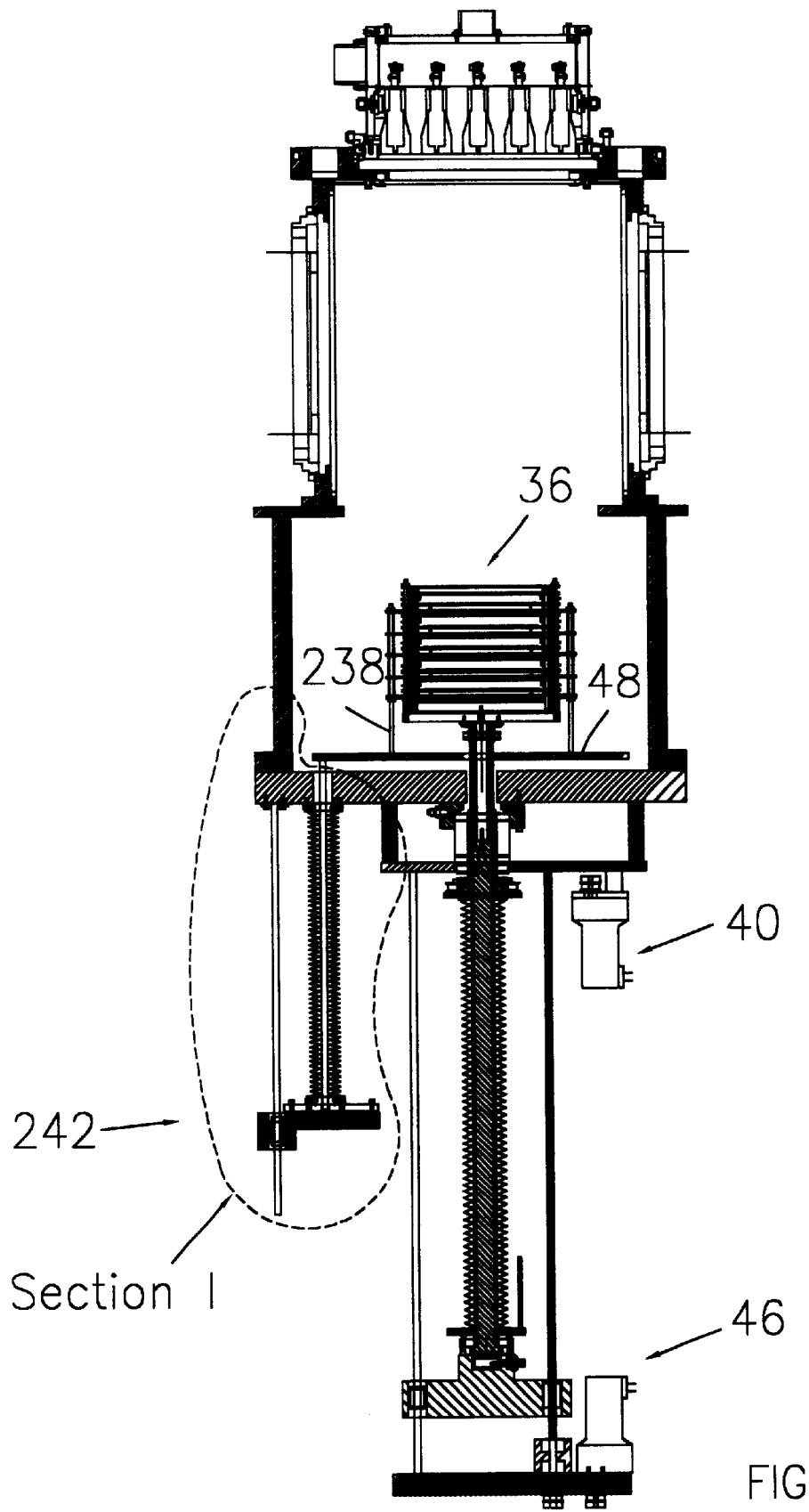
FIG. 18 shows the boat in the fully down position.
Figure 19:
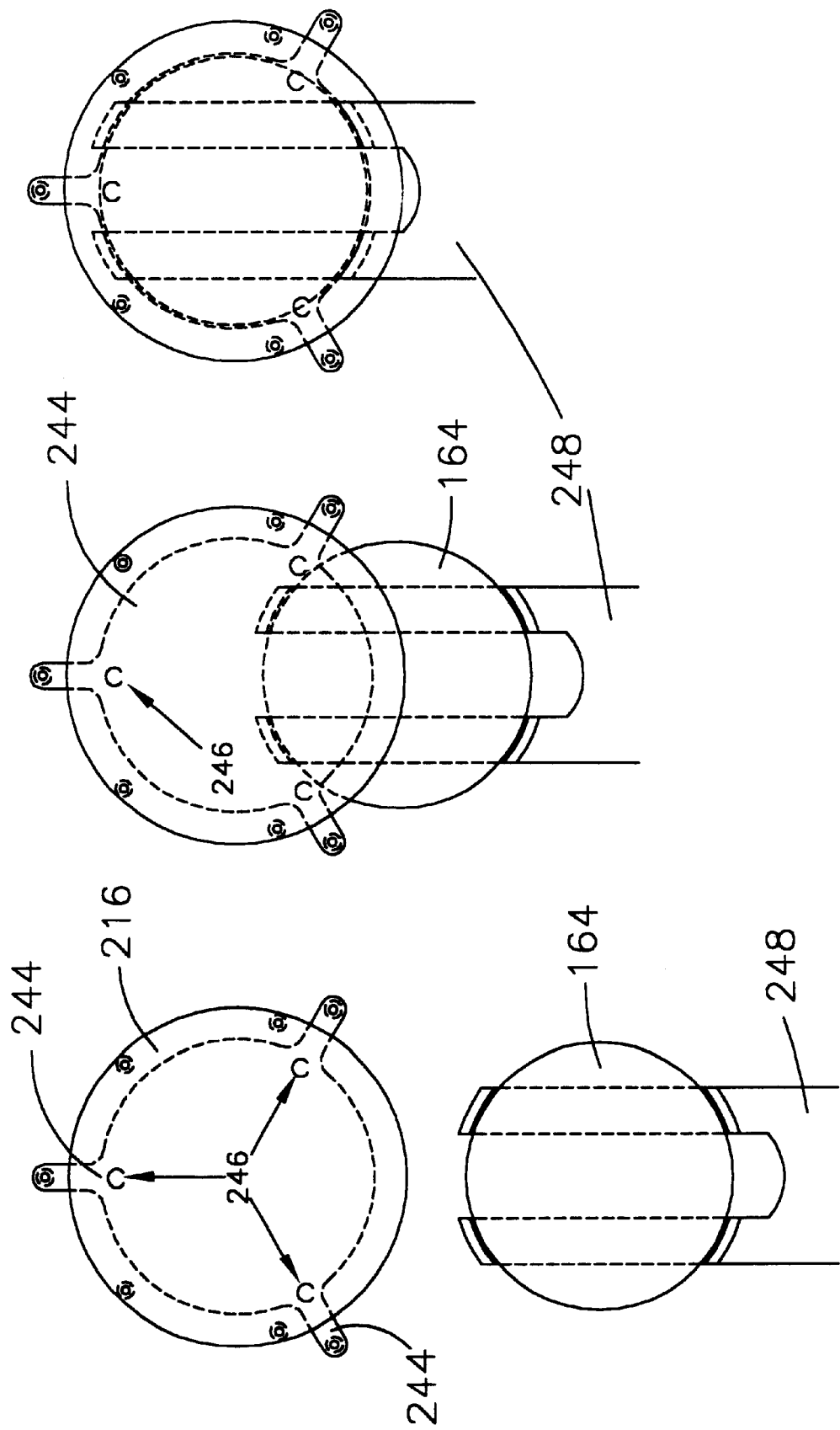
FIG. 19 shows a top view of the boat showing a wafer being loaded on pins using a robotic arm.

FIG. 18 shows the boat 36 in the fully down position. Wafers 164 are then loaded onto the pins 246 and unloaded from the pins 246 via a robotic arm which in FIG. 18 would be moving in a plane perpendicular to the paper on which the figure is drawn. FIG. 19 shows a top view of boat 36 showing the wafer 164 being loaded onto the pins 246 via the robotic arm's end effector 248. The robotic arm's "Z" motion allows it to position the wafer 164 above the pins 246 and then the arm lowers to rest the wafers onto the pins 246. Once the end effector 248 is below the plane of the wafer 164, the end effector 248 is pulled out of the reactor via the robotic arm. The wafers 164 can be loaded one at a time through a slit valve or all at once via a multiple level end effector which passes through a larger rectangular valve in the wall of the reactor 22.

Figure 20:
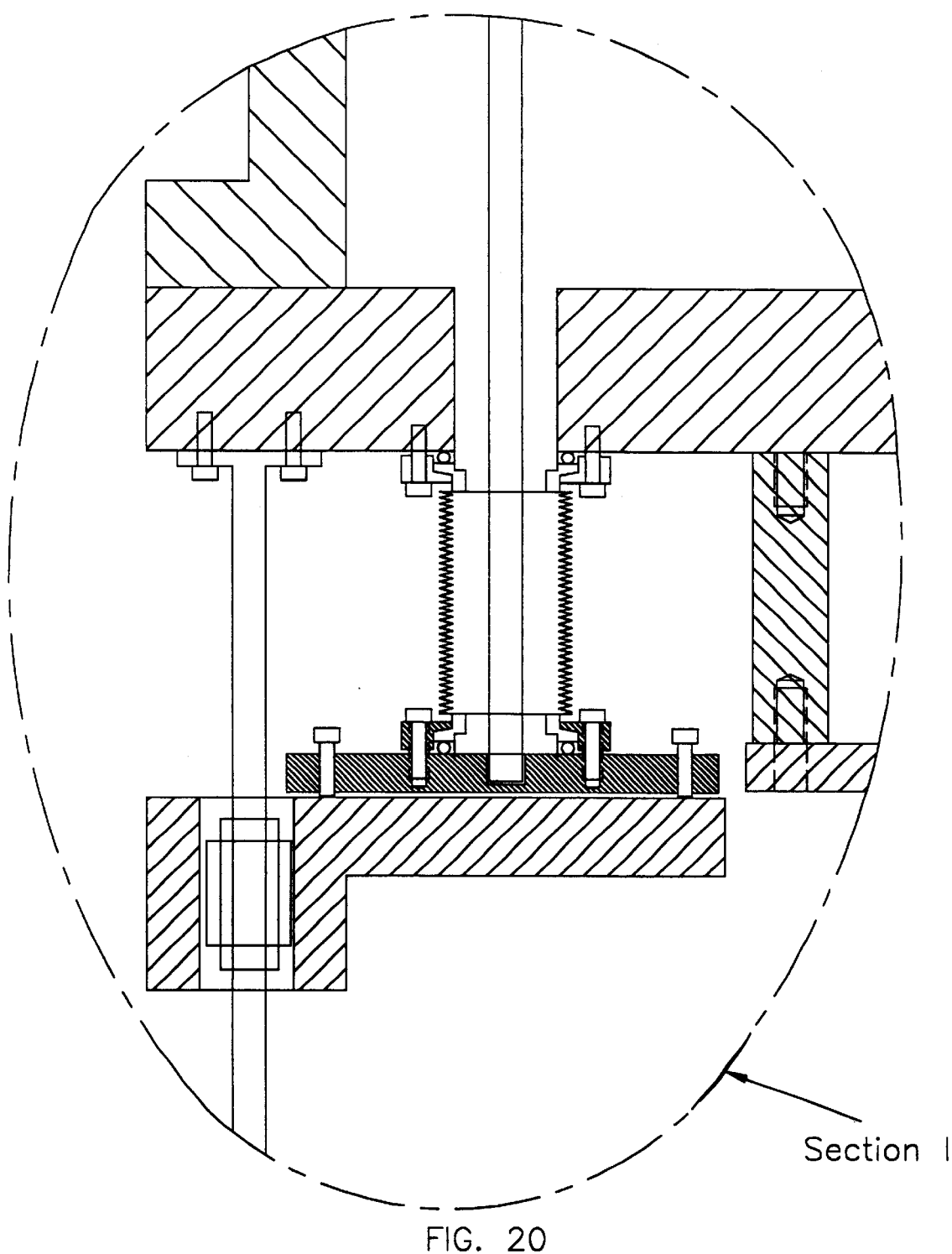
FIG. 20 is an enlargened view of section I of FIG. 3 showing further detail of the vertical motion mechanism.

FIG. 20 shows apparatus in Section I referenced to FIG. 3, including the vertical motion mechanism 242. More detail on the mechanism is provided in U.S. patent application Ser. No. 08/909.461.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A reactor for deposition of a film on a surface of each of a plurality of wafers, said reactor comprising:
   (a) a first chamber having an interior for placement of a wafer boat for processing a plurality of wafers, said chamber further including
      (i) a chamber wall having a window for transmission of radiant heat energy from the exterior of said chamber through said window to said interior for heating said plurality of wafers;
      (ii) a thermal plate positioned between said window and said interior for diffusing said heat energy for heating said wafers on said boat;
   (b) radiant heater apparatus positioned exterior of said first chamber for radiating said heat energy through said window to said interior for heating said thermal plate;
   (c) positioning apparatus for positioning said wafer boat in the first chamber, the wafer boat capable of holding a plurality of wafers in a vertical stack arrangement, the wafer boat including a plurality of RF plates and a plurality of susceptors, wherein each of the plurality of wafers is positioned with a flat deposition surface oriented horizontally, each wafer on a susceptor beneath an RF plate, each susceptor connected to a connection apparatus for connecting to a first side of an RF power supply, and each RF plate connected to a connection apparatus for connecting to a second side of said RF power supply;
   (d) injector apparatus for introducing a reactant gas mixture to the first chamber, said injector apparatus for injecting reactant gas directed parallel to each said deposition surface of each wafer upon which said film is to be deposited; and
   (e) exhaust apparatus for exhausting the gas mixture from the first chamber, said exhaust apparatus for pulling said injector reactant gas parallel to each said deposition surface and colinear with a direction of said injected gas, said exhaust apparatus positioned opposite said boat from said injector apparatus.

2. The reactor of claim 1, further comprising apparatus for rotating the wafer boat while the plasma exists.

3. A reactor as recited in claim 1 further comprising:
   (a) a second enclosed chamber below the first chamber;
   (b) apparatus for isolating the first chamber from the second chamber;
   (c) a drive for moving the wafer boat between the first and second chambers;
   (d) a lift mechanism in the second chamber for lifting the wafers onto and off of the susceptors; and
   (e) a robotic arm for loading and unloading the wafers.

4. The reactor of claim 3, further comprising apparatus for rotating the wafer boat while the plasma exists.

* * * * *